(12) United States Patent
Takano et al.

(10) Patent No.: US 7,592,701 B2
(45) Date of Patent: Sep. 22, 2009

(54) ELECTRODE STRUCTURE, PART MOUNTING STRUCTURE AND LIQUID CRYSTAL DISPLAY UNIT EQUIPPED WITH THE PART MOUNTING STRUCTURE

(75) Inventors: Daijiro Takano, Komatsu (JP); Hikaru Fujita, Kanazawa (JP)

(73) Assignee: Toshiba Matsushita Display Technology Co., Ltd., Tokyo (JP)

( * ) Notice: Subject to any disclaimer, the term of this patent is extended or adjusted under 35 U.S.C. 154(b) by 237 days.

(21) Appl. No.: 11/305,126

(22) Filed: Dec. 19, 2005

(65) Prior Publication Data
US 2006/0157844 A1 Jul. 20, 2006

(30) Foreign Application Priority Data
Dec. 28, 2004 (JP) ............................. 2004-381813

(51) Int. Cl.
*H01L 23/48* (2006.01)
*H01L 23/52* (2006.01)
(52) U.S. Cl. ...................... 257/773; 257/786; 257/775; 257/E23.02
(58) Field of Classification Search ................ 257/773, 257/786, 778, 775, E23.02
See application file for complete search history.

(56) References Cited

U.S. PATENT DOCUMENTS

| 4,594,606 | A  | * | 6/1986 | Goto et al. .................. 257/776 |
| 5,186,383 | A  | * | 2/1993 | Melton et al. ........... 228/180.22 |
| 5,422,516 | A  | * | 6/1995 | Hosokawa et al. .......... 257/775 |
| 6,081,036 | A  | * | 6/2000 | Hirano et al. ................ 257/773 |
| 6,525,422 | B1 | * | 2/2003 | Ono et al. .................... 257/737 |
| 2003/0062623 | A1 | * | 4/2003 | Ono et al. .................... 257/737 |
| 2003/0067084 | A1 | * | 4/2003 | Shintani ..................... 257/778 |

FOREIGN PATENT DOCUMENTS

| JP | 2000-75324 | 3/2000 |
| JP | 2003-280541 | 10/2003 |

* cited by examiner

*Primary Examiner*—Nitin Parekh
(74) *Attorney, Agent, or Firm*—Oblon, Spivak, McClelland, Maier & Neustadt, L.L.P.

(57) ABSTRACT

An electrode structure includes at least a contact button portion that has a portion of multilayer structure of two or more conductor layers stacked and enlarged in area. A part mounting structure includes a substrate, a contact button portion which is formed on the substrate and on which a part is mounted by connection via a bump, wherein at least the contact button portion has a portion of multilayer structure of two or more conductor layers stacked, a part of which is enlarged in area. A liquid crystal display unit is equipped with the part mounting structure.

2 Claims, 4 Drawing Sheets

Fig.1(a)
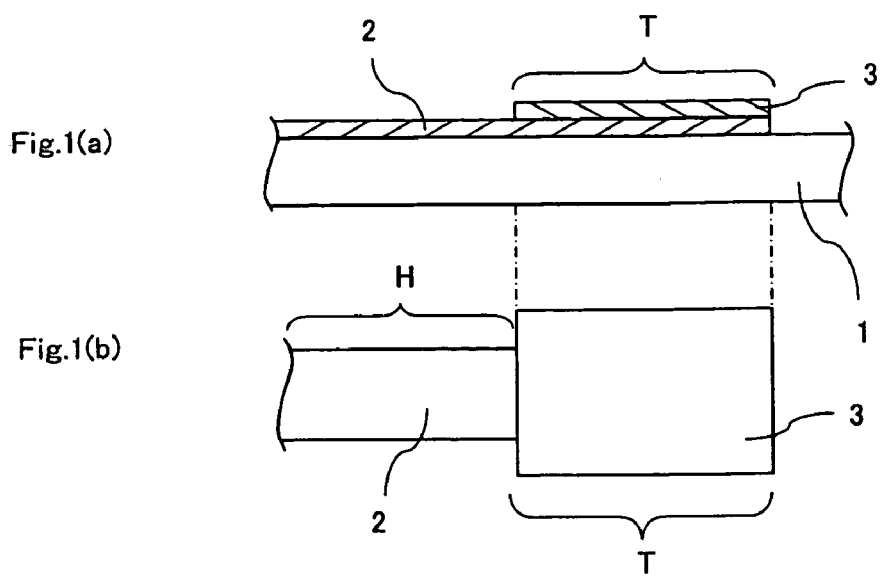
Fig.1(b)
Fig.2
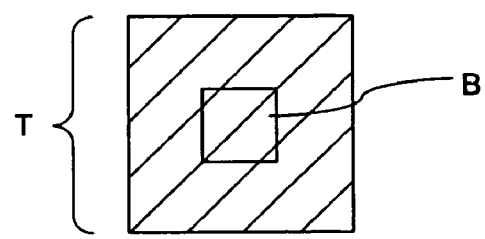
Fig.3
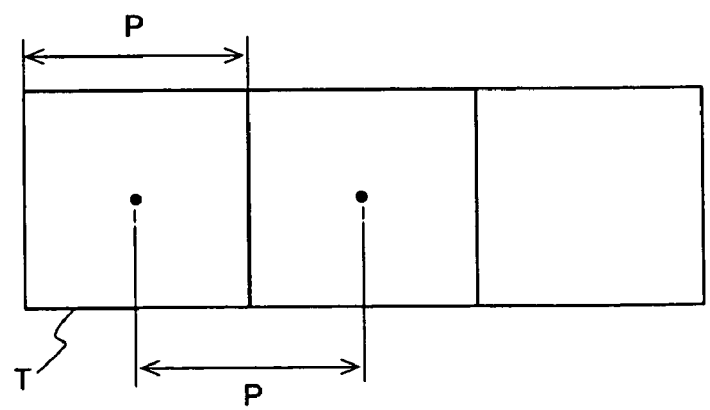

Fig.8
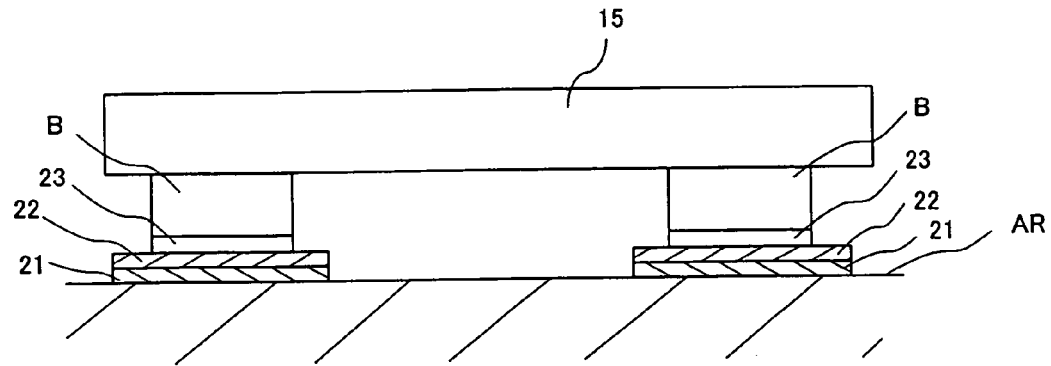
Fig.9       PRIOR ART
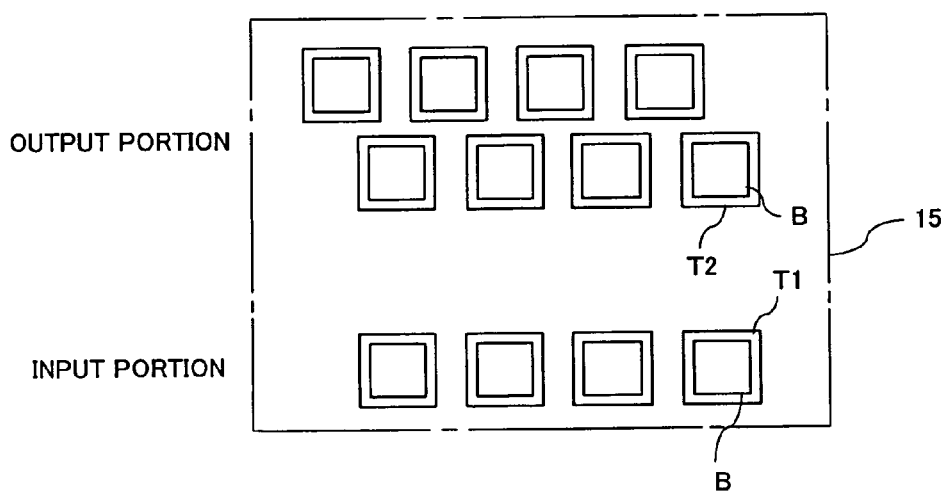
Fig.10
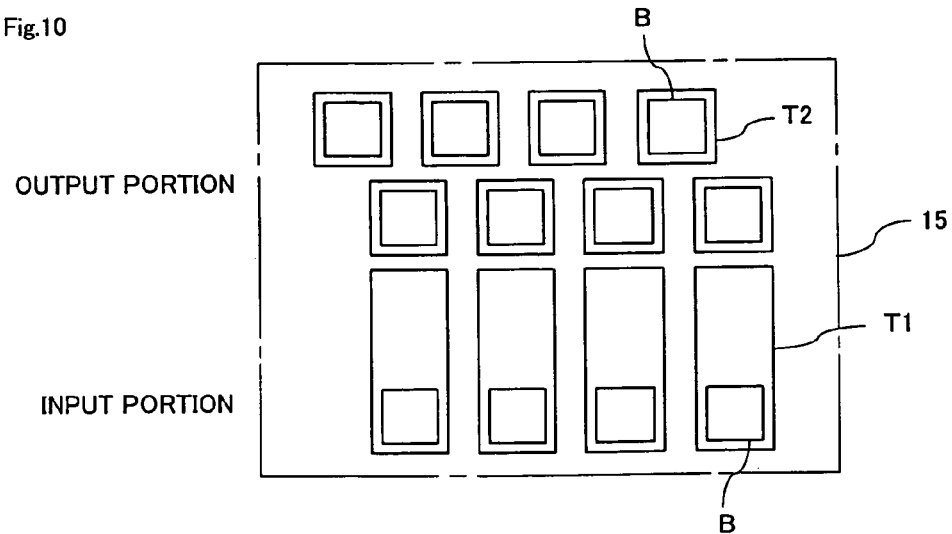

ELECTRODE STRUCTURE, PART MOUNTING STRUCTURE AND LIQUID CRYSTAL DISPLAY UNIT EQUIPPED WITH THE PART MOUNTING STRUCTURE

BACKGROUND OF THE INVENTION

1. Field of the Invention

The present invention relates to an electrode structure in a panel electrode etc. of a liquid crystal display unit, for example, to a part mounting structure in the panel electrode etc. and particularly to a liquid crystal display unit equipped with the part mounting structure.

2. Description of the Prior Art

Since a liquid crystal display unit, for example, is a planar display unit having excellent properties, such as small thickness, light weight, low power consumption, etc., it is put to a wide range of applications to mobile devices, such as a Personal Digital Assistance (so-called PDA) or a portable telephone, etc., to the display of a personal computer, etc.

The liquid crystal display unit has a liquid crystal panel of a structure having a liquid crystal layer sandwiched between a pair of display panel substrates, i.e. an array substrate and an opposed substrate, and controlled by applying voltage selectively to pixels between the array substrate and the opposed substrate to display images on the liquid crystal panel. In an active matrix liquid crystal display panel, for example, an amorphous silicon or polysilicon semiconductor is used for an array substrate to form a Thin-Film Transistor (TFT) as a switching device and simultaneously form pixel electrodes, scan lines, signal lines and so on connected to the switching device. On the other hand, an opposed substrate is formed with opposed electrodes of Indium Tin Oxide (ITO) or the like, color filters, etc.

In the liquid crystal display unit of the structure mentioned above, with an aim to reduce the weight and thickness thereof, the array substrate has a scan line-operating circuit and a signal line-operating circuit built-in. Particularly, since the signal line-operating circuit has to be operated at higher speed than the scan line-operating circuit, it is formed as an IC chip, for example, and the IC chip is mounted on the array substrate using the Chip On Glass (COG) technique. The IC chip is mounted as being connected onto a panel electrode provided on the outer edge of the array substrate via a bump, receives signals output from an external control circuit and inputs image-controlling signals to the scan lines and signal lines of the array substrate.

In case where the array substrate is formed with the panel electrode on which the IC chip is mounted, as described above, it is conceivable that it is advantageous to form the panel electrode in a multilayer structure for the purpose of securing the reliability thereof. To be specific, a conductor layer of ITO is stacked on a conductor layer of aluminum to protect the conductor layer of metal, thereby expecting suppression of corrosion occurrence etc. and improvement in the reliability.

Generally, a wiring layer formed on a substrate is covered with a solder resist layer to protect it from corrosion, damages and adverse affects by adherence of extraneous material. Furthermore, it is also discussed in JP-A 2000-75324 to form a protective layer on a wiring layer. Since the electrode portion requires electrical connection, it cannot be covered with the solder resist layer and is brought to an exposed state. While there is concern that the conductor layer in the electrode portion is corroded, therefore, it is conceivable to protect the conductor layer of metal from corrosion etc. when the metal conductor layer is covered with a layer of oxide, such as ITO.

In consequence of various studies conducted by the inventors, it has been found that a problem arises in terms of connection resistance where the conductor layer of aluminum has been covered with the conductor layer of ITO. Ordinarily, when the connection resistance of the IC chip mounted is thought of, the connection resistance between the bump and the electrode is mainly considered. When the panel electrode has been formed in the aforementioned multilayer structure, however, contact resistance will occur in a portion of contact between the conductor layer of aluminum and the conductor layer of ITO. The contact resistance is in inverse proportion to the area of contact between the conductor layer of aluminum and the conductor layer of ITO. In the liquid crystal display unit, since the COG portion has a smaller contact area than a Film On Glass (FOG) portion, for example, the COG portion is prone to high contact resistance and has a possibility of the electrical signals being adversely affected. Particularly, the input terminal portion is susceptible to this adverse affect.

The present invention has been proposed in view of the conventional state of affairs. One object of the invention is to provide an electrode structure and a part mounting structure capable of suppressing reliability degradation and connection resistance (contact resistance). Another object of the invention is to provide a part mounting structure and a liquid crystal display unit, with input signals not adversely affected, highly reliable in connecting parts.

SUMMARY OF THE INVENTION

To attain the above objects, the present invention provides an electrode structure comprising at least a contact button portion that has a multilayer structure of two or more conductor layers stacked and enlarged in area, further provides a part mounting structure comprising a substrate, a contact button portion which is formed on the substrate and on which a part is mounted by connection via a bump, wherein at least the contact button portion has a multilayer structure of two or more conductor layers stacked, a part of which is enlarged in area and further provides a liquid crystal display unit equipped with the part mounting structure.

In the electrode structure having a multilayer structure of two or more conductor layers stacked, contact resistance between the conductor layers is in inverse proportion to an area of portions of the multilayer structure. That is to say, the larger the area of portions of the multilayer structure, the lower the contact resistance, whereas the smaller the area, the higher the contact resistance.

In the present invention, therefore, the area of the portions of the multilayer structure is enlarged to suppress the contact resistance. Here, the enlargement of the area of the portions of the multilayer structure means making the area of the contact button portion larger than the area of a generally designed contact button portion. Specifically, the area of the portions of the multilayer structure is set to be twice or more the area of contact between the contact button portion and the bump connected to the surface thereof. Otherwise, when the contact button portion has contact buttons arrayed at prescribed pitch, the area of the portions of the multilayer structure is made larger than the area of a square having the pitch as a side. While each of these means enlargement of the area of the contact button portion itself, in the present invention, the portions of the multilayer structure may be enlarged over the drawing wire portion drawn from the contact button portion.

According to the present invention, it is possible to provide an electrode structure and a part mounting structure capable of reducing the contact resistance between the conductor layers to a great extent and exhibiting high reliability enabling the connection resistance to be made small and corrosion etc. to be suppressed. Also, according to the present invention, since the connection resistance of a part to be mounted can be reduced and since input electrical signals etc. cannot be adversely affected, it is made possible to provide a highly reliable part mounting structure and liquid crystal display unit in these respects.

The above and other objects, characteristic features and advantages of the invention will become apparent to those skilled in the art from the description to be made herein below with reference to the accompanying drawings.

BRIEF DESCRIPTION OF THE DRAWINGS

FIG. 1(a) is a schematic cross section showing the structure of a contact button portion, and FIG. 1(b) a plan view thereof.

FIG. 2 is a schematic plan view showing an example of the shape of the contact button portion.

FIG. 3 is a conventional pattern diagram showing the relationship between the pitch p of the contact button portion and the formable squares.

FIG. 8 is a side view showing an example of an IC chip mounting structure.

FIG. 9 is a plan view schematically showing an example of a conventional ordinary panel electrode array.

FIG. 10 is a plan view schematically showing another example of a panel electrode array in which panel electrodes on an input side are formed in a rectangular shape to enlarge the area thereof.

DETAILED DESCRIPTION OF THE PREFERRED EMBODIMENTS

Figure 4:
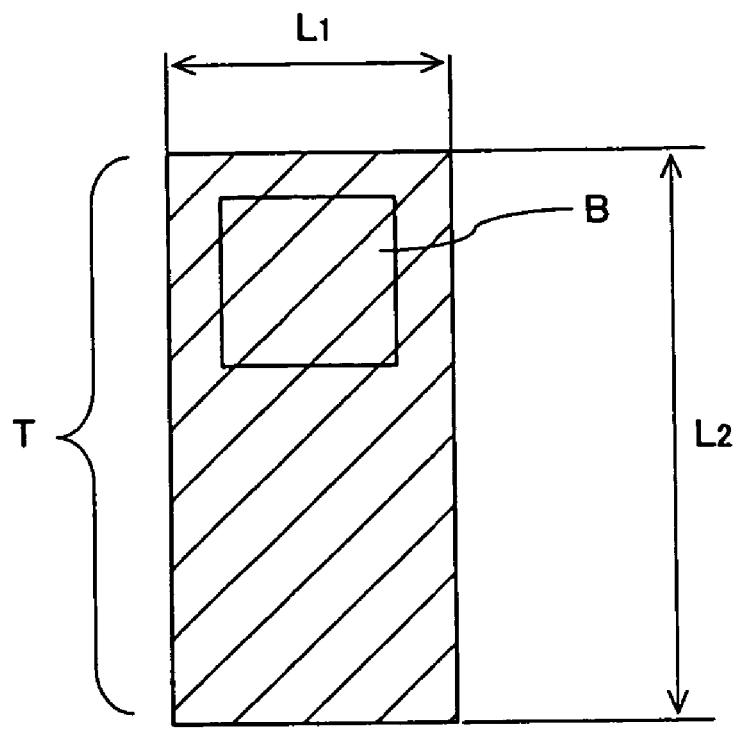
FIG. 4 is a schematic plan view showing an example of the contact button portion made rectangular.

An electrode structure, a part mounting structure and a liquid crystal display unit according to the present invention will be described hereinafter with reference to the accompanying drawings.

FIG. 1 illustrates one embodiment of an electrode structure according to the present invention that has two or more conductor layers stacked in a contact button portion. In this embodiment, on a substrate 1 is formed a first conductor layer 2 as a wire layer on which a second conductor layer 3 is formed as stacked thereon in a contact button portion. In the first conductor layer 2, a drawing wire portion H is covered with a resist and there is no case where the second conductor layer 3 is stacked on the drawing wire portion H. In the contact button portion T, the resist is formed with an opening for electrical connection and, since the portion of the opening is exposed, it is covered with the second conductor layer 3 to form the portion of a multilayer structure.

The first conductor layer 2 is formed of metal material having small electrical resistance, such as Al, Ti, W, etc., for example to allow wire resistance to be as small as possible. On the other hand, the second conductor layer 3 is formed of oxide material having high corrosion resistance, such as ITO etc. having small electrical resistance and functioning as a conductor.

In the electrode structure mentioned above, the contact resistance between the first and second conductor layers 2 and 3 at the contact button portion T will be problematic. When the contact resistance is large, the resistance between the terminal of a part to be mounted and the wiring for inputting external signals will become large, resulting in problematic deterioration of the input signals.

In view of the above, the present invention has enlarged the area of the portion of multilayer structure comprising the first and second conductor layers 2 and 3, i.e. the area of contact button portion T to suppress the contact resistance. FIG. 2 shows one example in which the area of the contact button portion T is enlarged. Generally, the size of the contact button portion T is determined by the size of a bump B of a part mounted on the contact button portion T. In the present invention, for example, the area of the contact button portion T is enlarged so that the distance from the periphery of the bump B to the edge of the contact button portion T may be 10 μm or more. Otherwise, the contact button portion T is designed to have an area twice or more the area of the bump B.

Furthermore, the area of the contact button portion T can be enlarged, with the pitch at which the contact button portions T are formed as the standard. As shown in FIG. 3, generally, the contact button portions T are formed, for example, at a pitch corresponding to the pitch of the terminals of parts. That is to say, the distance (pitch) p between the centers of the contact button portions is equal to the pitch of the terminals. In this case, in the adjacent contact button portions T, the contact button portions T cannot be formed so that the distance from each center to each edge of each contact button portion may be larger than ½ of the pitch p (i.e. p/2). Therefore, the maximum value of the area of the contact button portion T is twice the p/2. Thus, the area of the contact button portion cannot exceed the area of a square having the pitch p as a side. When there is an excessive part, since the adjacent contact button portions have overlapped portions, it is difficult to electrically isolate the adjacent contact button portions.

In view of the above, the present invention has adopted a rectangular contact button portion T, as shown in FIG. 4, for example, so as to make the area of the contact button portion T (portion of multilayer structure) larger than the area of the square having the pitch p as a side. In the case where the contact button portions T are disposed at the prescribed pitch p, the width $L_1$ of the contact button portion T cannot be made larger than the pitch p. On the other hand, the length $L_2$ orthogonal to the width $L_1$ can optionally be set. Therefore, by setting the relationship between $L_1$ and $L_2$ to be $L_2 > L_1$, the area of the contact button portion can be enlarged as compared with the area of the square one, thereby enabling the contact resistance between the first and second conductor layers 2 and 3 to be reduced to a great extent.

Figure 5:
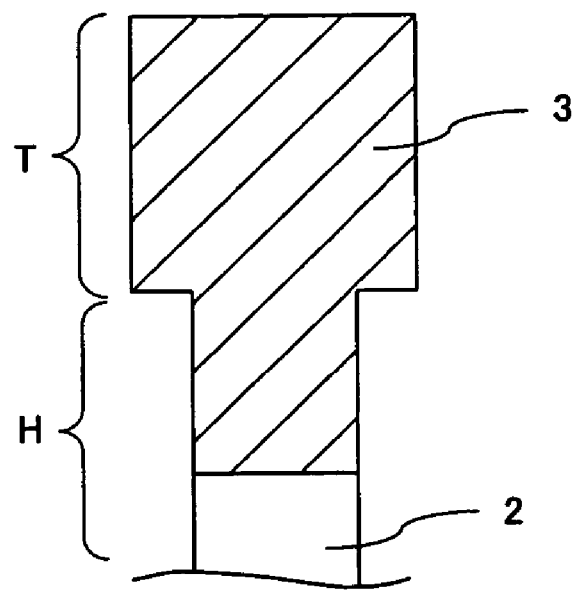
FIG. 5 is a schematic plan view showing an example of a second conductor layer enlarged over a drawing wire portion.

As has been described in the foregoing, the examples have been cited, in which the area of the portion of multilayer structure is enlarged, with the shape and size of the contact button portion changed. However, the present invention is not limited to the examples. As shown in FIG. 5, for example, the area of the portion of multilayer structure can be enlarged when the second conductor layer 3 is formed over the drawing wire portion H of the first conductor layer 2, provided that the area of the second conductor layer 3 exposed becomes larger, resulting in an problem arising due to adverse affects by adherence of extraneous material. Therefore, the area of the second conductor layer 3 formed onto the drawing wire portion H of the first conductor layer 2 is preferred to be a requisite minimum.

Next, a part mounting structure to which the aforementioned electrode structure is applied will be described using a liquid crystal display unit as an example.

Figure 6:
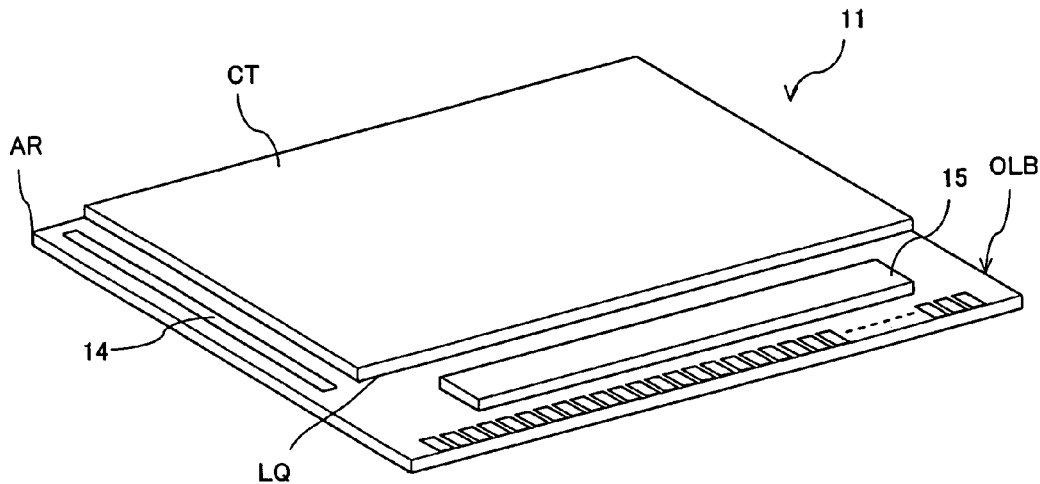
FIG. 6 is a schematic perspective view showing an example of a liquid crystal display panel.
Figure 7:
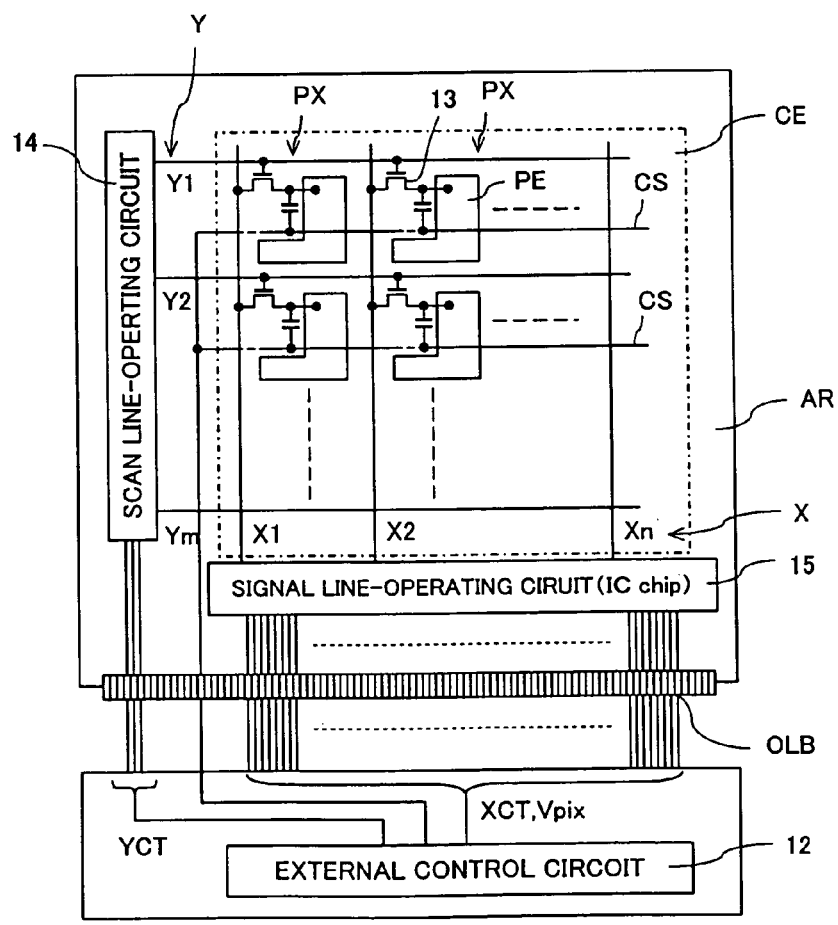
FIG. 7 is a diagram showing an example of a circuit configuration of a liquid crystal display unit.

FIG. 6 schematically shows one example of a liquid crystal display panel of a liquid crystal display unit, and FIG. 7 shows a schematic circuit structure of the liquid crystal display unit of FIG. 6. This liquid crystal display unit is equipped with a liquid crystal display panel 11 and an external control circuit 12 for controlling the liquid crystal display panel 11. The liquid crystal display panel 11 has a structure having a liquid crystal layer LQ retained between a pair of display panel substrates that are an array substrate AR and an opposed substrate CT. The external control circuit 12 is disposed a circuit substrate independent of the liquid crystal display panel 11.

The array substrate AR includes (m×n) number of pixel electrodes PE disposed in matrix form, m number of scan lines Y (Y1 to Ym) formed along the rows of the pixel electrodes PE, n number of signal lines X (X1 to Xn) formed along the columns of the pixel electrodes PE, (m×n) number of pixel switches 13 disposed in the neighborhood of positions of intersections between the signal lines X1 to Xn and the scan lines Y1 to Ym and formed each of an N-channel TFT of polysilicon, for example, sub-capacity lines CS disposed parallel to the scan lines Y1 to Ym and connected in capacity to the corresponding rows of pixel electrodes PE, a scan line-operating circuit 14 for operating the scan lines Y1 to Ym, an IC chip 15 constituting a signal line-operating circuit for operating the signal lines X1 to Xn and a plurality of connection pads OLB used for connection between the external control circuit 12 and the array substrate AR.

The opposed substrate CT includes a single opposed electrode CE disposed as facing the (m×n) number of pixel electrodes PE and set to have a common potential Vcom. The common potential Vcom is also applied to the sub-capacity lines CS, for example.

The external control circuit 12 receives digital image signals and synchronized signals fed from a processing circuit of a mobile device and generates pixel display signals Vpix, vertical scanning control signals YCT and horizontal scanning control signals XCT. The vertical scanning control signals VCT are fed to the scan line-operating circuit 14, and the horizontal scanning control signals XCT are fed together with the pixel display signals Vpix to the IC chip 15 constituting the signal line-operating circuit. The scan line-operating circuit 14 is controlled with the vertical scanning control signals YCT so that it may feed scanning signals sequentially to the scan lines Y1 to Ym every one vertical scanning (frame) period. The built-in signal line-operating circuit of the IC chip 15 is controlled with the horizontal scanning control signals, XCT so that it may make series-parallel conversion of digital image signals input during the one horizontal scanning period (1H) in which the individual scan lines Y are operated with the scanning signals and further feed the digital-analog-converted display signals Vpix to the signal lines X1 to Xn, respectively, in analog format.

In the liquid crystal display unit, a display screen comprises (m×n) number of pixels PX corresponding in number to (m×n) number of pixel electrodes PE that constitute the liquid crystal layer LQ and each defined by two adjacent scan lines Y and by two adjacent signal lines X. The scan line-operating circuit 14 and IC chip having the signal line-operating circuit built-in are disposed, as shown in FIG. 6 and FIG. 7, outside the (m×n) number of pixels, and the plurality of connection pads are disposed on the peripheral edge of the array substrate AR. The IC chip 15 having the signal line-operating circuit built-in is disposed inside the connection pads OLB. Each pixel switch 13 replies to a scanning signal from a corresponding scan line Y to sample a pixel display signal Vpix from a corresponding signal line X and applies the sampled signal to a corresponding pixel electrode PE to control the light transmission of a corresponding pixel PX based on a difference in potential between the pixel electrode PE and the opposed electrode CE.

In the liquid crystal display unit of the structure mentioned above, the IC chip 15 that is a part is mounted on the array substrate AR as connected to a panel electrode of the array electrode. The mounting structure of the IC chip 15 will now be described below.

On the array substrate AR, as shown in FIG. 8, there are formed contact button portions T as panel electrodes each having a multilayer structure having a first conductor layer 21 of Al etc. and a second conductor layer 22 of ITO etc. stacked. The IC chip 15 has bumps B at the bottom thereof and is electrically connected to the second conductor layers 22, i.e. the contact button portions T, via anisotropy conductive adhesive layers 23.

FIG. 9 shows a conventional ordinary pattern of contact button portions T formed. On the array substrate AR, there are formed contact button portions T1 (arrayed in a pattern disposed on the lower side in FIG. 9) corresponding to an input portion of the IC chip 15 and contact button portions T2 (arrayed in a pattern disposed on the upper side in FIG. 9) corresponding to an output portion of the IC chip 15. By connecting the bumps B of the IC chip 15 to these contact button portions T1 and T2, the IC chip 15 is mounted on the array substrate AR.

Here, in the ordinary liquid crystal panel, the contact button portion T1 on the input side has substantially the same area as the contact button portion T2 on the output side. In such a case as this, when the pitch of the contact button portions T1 or T2 becomes small, the area thereof becomes small, resulting in high contact resistance between the first and second conductor layers 21 and 22. Such high contact resistance brings about deterioration of the signals particularly at the input portion having a large current value.

As shown in FIG. 10, therefore, the area of each contact button portion T1 on the input side is enlarged in the present invention to reduce the contact resistance between the first and second conductor layers 21 and 22. To obtain the area enlargement, while any of the examples shown in FIG. 2, FIG. 4 and FIG. 5 can be adopted, contact button portions T1 having a rectangular shape are advantageous because they can fall within the project area of the IC chip (shown by a dashed line in FIG. 9 or FIG. 10).

In the case of the area enlargement, the second conductor layer 22 is exposed to a large extent. When extraneous material adheres to the portion of the second conductor layer 22 exposed, it possibly gives rise to adverse effects including unintentional short circuits etc. By forming the contact button portions T1 in a rectangular shape and concealing them below the IC chip 15, it is possible to suppress the possibility of extraneous material adhering to the portion of the second conductor layer 22 exposed. Thus, this is preferred in terms of reliability.

The configuration of the liquid crystal display unit to which the mounting structure of the present invention is applied is as described in the foregoing. The inventors confirmed the effect of the area enlargement through the measurements of resistance values. To be specific, in the case of the ordinary connection (shown in FIG. 9 and defined as a Comparative Example) and in the case of the present connection having the contact button portion T1 formed in a rectangular shape to double the area of contact between the first and second conductor layers 21 and 22 (shown in FIG. 10 and defined as an Example, the resistant value was measured at five points in each case. The resistance value at each point of measurement and average value of the resistance values in the Example and Comparative Example and ratio of the resistance values (average value) of the Example relative to the Comparative Example are shown in Table 1 below.

TABLE 1

| | Resistance value ($\Omega$) at each point of measurement | | | | | Average | |
|---|---|---|---|---|---|---|---|
| | 1 | 2 | 3 | 4 | 5 | value ($\Omega$) | Ratio |
| Comparative Example | 11.0 | 16.9 | 12.2 | 5.3 | 10.1 | 11.1 | 1.0 |
| Example | 7.7 | 5.6 | 4.3 | 2.5 | 3.0 | 4.6 | 0.4 |

As is clear from Table 1 above, the enlargement of the area of contact between the first and second conductor layers 21 and 22 reduces the resistance values to a great extent. In the Example, the resistance values (average value) are reduced by ½ those in Comparative Example. The difference in resistance value is concerned directly with the difference in mounting resistance. Thus, the superiority of the application of the present invention proves apparent.

What is claimed is:

1. A liquid crystal display unit equipped with a part mounting structure comprising:
   a substrate; and
   a contact button portion which is formed on the substrate and on which the part is mounted by connection via a bump, wherein
   at least the contact button portion having input and output terminal portions, each terminal portion having a portion of multilayer structure of two or more conductor layers stacked on each other,
   the portion of multilayer structure corresponding to the input terminal portion having an area twice or more than twice of an area of the bump connected to the respective contact button portion in a plan view,
   the two or more conductor layers comprise a first conductor layer of a metal film and a second conductor layer of an indium tin oxide (ITO) formed on the first conductor layer, and
   the portion of multilayer structure falls within a projected area of the part in the plan view.

2. A liquid crystal display unit equipped with a part mounting structure comprising:
   a substrate; and
   a contact button portion which is formed on the substrate and on which the part is mounted by connection via a bump, wherein
   at least the contact button portion having input and output terminal portions, each terminal portion having a portion of multilayer structure of two or more conductor layers stacked on each other,
   the contact button portion has contact buttons arrayed at a prescribed pitch,
   the portion of multilayer structure
   corresponding to the input terminal portion having an area made larger than twice an area of a square having the pitch as a side and twice or more than twice of an area of the bump connected to the respective contact button portion in a plan view
   the two or more conductor layers comprise a first conductor layer of a metal film and a second conductor layer of ITO formed on the first conductor layer, and
   the portion of multilayer structure falls within a projected area of the part in the plan view.

* * * * *